United States Patent

Mahant-Shetti et al.

[11] Patent Number: 6,058,404
[45] Date of Patent: *May 2, 2000

[54] APPARATUS AND METHOD FOR A CLASS OF IIR/FIR FILTERS

[75] Inventors: Shivaling Mahant-Shetti, Garland; Alan Gatherer, Richardson, both of Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/838,841

[22] Filed: Apr. 11, 1997

[51] Int. Cl.$^7$ ........................................................ G06F 17/10
[52] U.S. Cl. ................................. 708/301; 708/320
[58] Field of Search ...................... 364/724.011, 724.012, 364/724.13, 724.16, 724.17; 375/350, 233; 708/300, 301, 320

[56] References Cited

U.S. PATENT DOCUMENTS

| | | | |
|---|---|---|---|
| 4,811,263 | 3/1989 | Hedley et al. | 364/724.13 |
| 4,817,025 | 3/1989 | Asai et al. | 364/724.01 |
| 4,862,403 | 8/1989 | Iwase et al. | 364/724.16 |
| 4,953,118 | 8/1990 | Gockler | 364/724.01 |
| 5,204,827 | 4/1993 | Fujita et al. | 364/724.1 |
| 5,381,358 | 1/1995 | Sakamoto | 364/724.17 |
| 5,517,527 | 5/1996 | Yu | 375/233 |
| 5,568,524 | 10/1996 | Bersen et al. | 375/350 |
| 5,717,727 | 2/1998 | Yamada et al. | 375/350 |

*Primary Examiner*—Chuong Dinh Ngo
*Attorney, Agent, or Firm*—Carlton H. Hoel; W. James Brady; Frederick J. Telecky, Jr.

[57] ABSTRACT

A digital filter can be implemented with a reduced number of components for a transform function having specific characteristics in the regions outside of a center region. The characteristics are that the transform function waveform is periodic with period T and has or can be approximated by at least one envelope, the envelope decaying a multiplier constant for each period T in a direction away from the waveform center. The digital filter has three groups of elements. A center group of components functions in a manner similar to the prior digital filters. A positive time group of components receives the signals from the center, and using a group of delay component, delays the signal by one period T, is reduced by the multiplier constant factor, and after having the current signal from the center group applied thereto, is once again applied to the positive time group delay components. Each positive time group delay component has coefficient multiplier component which multiplies the signal in the associated delay component by a cumulative coefficient prior to applying the signal to the output line. The negative time group of components can include a group of delay components and coefficient multiplier components which function in the prior art manner. In the alternative, the negative time group of components can include a series of delay component which applies the signal transmitted therethrough to the center group of components and to the a negative time group of component similar in structure and function to the positive time group of components.

5 Claims, 4 Drawing Sheets

APPARATUS AND METHOD FOR A CLASS OF IIR/FIR FILTERS

BACKGROUND OF THE INVENTION

1. Field of the Invention

This invention relates generally to digital filters and, more particularly, to the implementation of sharp cut-off filters based on certain classes of functions used extensively in communication circuits. This invention relates to the digital implementation of infinite impulse response (IIR) filters and finite response (FIR) filters.

2. Description of the Related Art

Digital filters receive an sampled digital signal and transmit the sampled waveform therethrough. The waveform transmitted by the digital filter is determined by coefficients operating on portions of the transmitted digital signal. A digital filter, according to the prior, is shown in FIG. 1. The digital signal is applied to, and transmitted by, a series of delay components 11. Each delay component 11 applies an output signal to a coefficient multiplication component 12. The signal from each delay line is multiplied, in the coefficient multiplication component 12, by a weighing factor derived from a transform function. The output signal from the coefficient multiplication components 12 are applied to the output terminal and provide the output signal. Thus, an input signal applied to the digital filter is, after an appropriate time delay, filtered according to the coefficient multiplier components and the resulting signal is applied to the output terminal.

Sharp cut-off digital filters find extensive use in communication circuits and are used more generally to reduce aliasing, i.e., artifacts which can occur in transmitted images as a result of rapid image change. Root raised cosine function and sin(x)/x function are examples of transform functions which can provide the coefficients for sharp cut-off digital filters. Referring to FIG. 2, a sin(x)/x function is illustrated. This function can be used as a transform function for a digital filter when the coefficients for the coefficient multiplier components are chosen from the value of the sin(x)/x waveform at locations corresponding to the delay in time resulting from passage through the delay components, for example, at points along the axis. The center of the transform function is typically specified to occur at time t=0 or $t_0$. The portions of the transform function to the left of the function center ($t_0$) are referred to as the negative time portions and the portions of the transform function to the right of the function center ($t_0$) are referred to as the negative time portions. Portions of the digital filter associated with the portions of the transform function can be similarly designated. The response of a digital filter to an impulse function typically exists for a long period of time. Therefore, FIR filters require a large number of delay components and associated coefficient multiplier components. The large number of delay elements required to implement a sharp cut-off digital filter presents problems in the design and fabrication of these devices.

A need has therefore been felt for apparatus and an associated method for providing a sharp cut-off digital filter which substantially reduces the number of delay lines and the associated coefficient multiplier components required to implement the related transform functions.

SUMMARY OF THE INVENTION

The aforementioned and other features are accomplished, according to the present invention, by providing a digital filter for a class of transform functions. The transform functions have positive and negative time regions which are periodic and have peripheral regions which have can be represented by a sum of decay functions. The digital filter is divided into three groups of delay components and coefficient multiplier components. The three groups include a center group, a positive time group, and negative time group of components. The central group of delay components and coefficient multiplier components interacts with the signal transmitted through the digital filter in a manner known in the prior art. For the positive time group, the group of components which receives an input signal after transmission of the input signal through the center group includes at least one group of series-coupled delay components included in a feedback circuit. Each of the series-coupled delay components has an associated coefficient multiplier unit, the output of the coefficient multiplier unit being applied to the output terminal. The negative time group of components includes a group of delay components and coefficient multiplier components coupled in a feedback circuit in a manner similar to the feedback circuit of the positive time group. The negative time group also includes a series-coupled group of delay lines which receive the input signal and applies the input signal after transmission through the series-coupled delay components to the negative time feedback circuit. This digital filter structure permits a large reduction in the number of delay components and coefficient multiplier components.

These and other features of the present invention will be understood upon the reading of the following description in conjunction with the Figures.

DESCRIPTION OF THE PREFERRED EMBODIMENT(S)

1. Detailed Description of the Drawings

Figure 1:
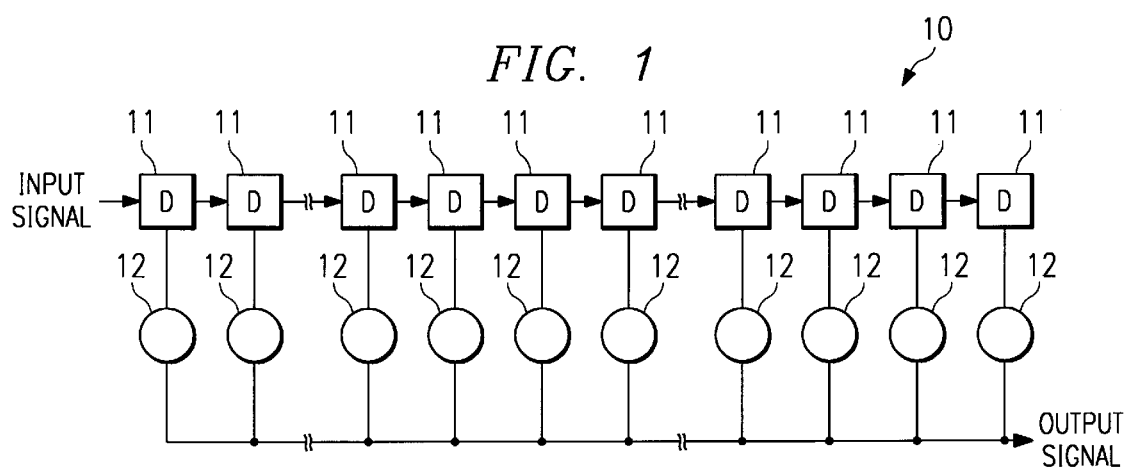
FIG. 1 illustrates an implementation of digital filter according to the prior art.
Figure 2:
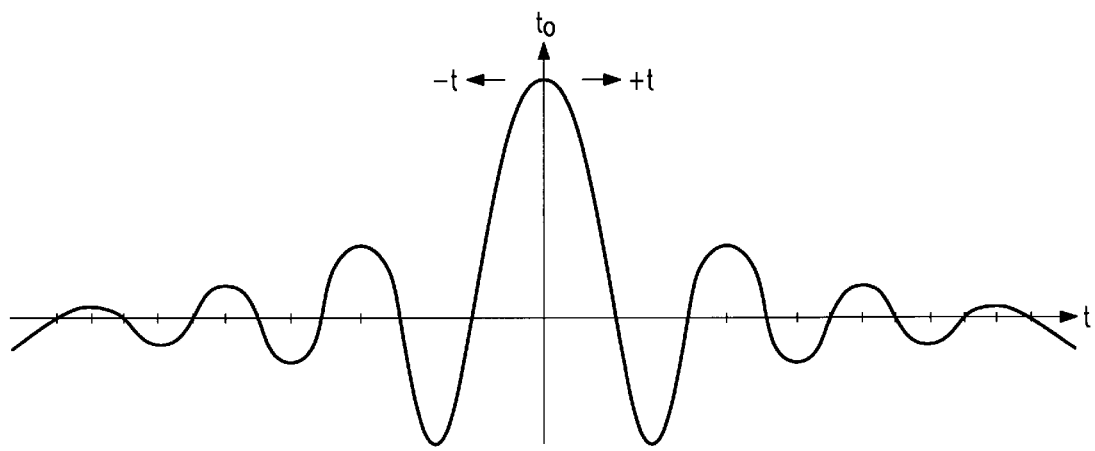
FIG. 2 illustrates a sin(x)/x function as well as a set of points which can be chosen to provide coefficients for a sharp cut-off functionality for the digital filter of FIG. 1.

FIG. 1 and FIG. 2 have been described with respect to the prior art.

Figure 3:
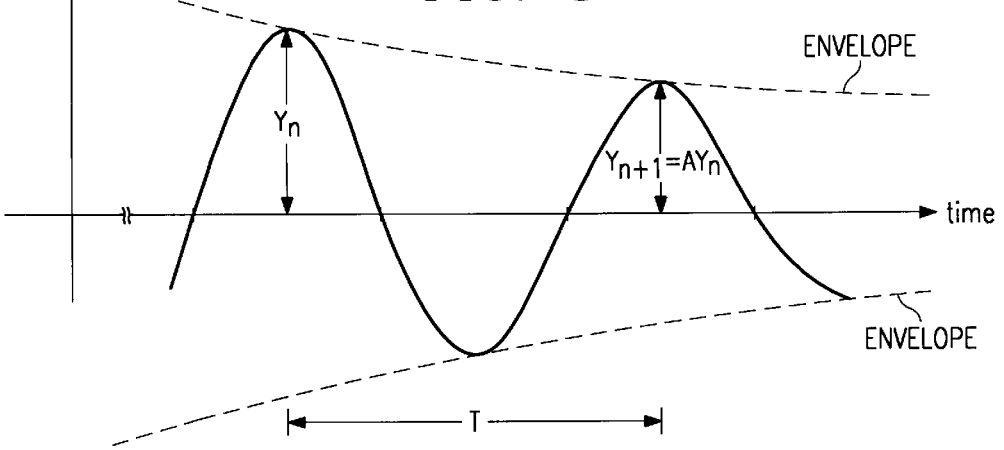
FIG. 3 illustrates the requirements for the transform functions for which the present invention provides an digital filter implementation.

Referring now to FIG. 3, the characteristics of transform function waveform, to which the present invention applies, are shown. A center portion, for which no specific waveform characteristics are required, can be implemented as is known in the prior art. For the negative/positive time portions on either side of the center portion, a waveform has the following characteristics. The waveform is a combination of periodic function of period T and an envelope decaying with respect to the center of the transform function. The function envelope can be approximated by at least one and possibly a sum of envelopes. Each envelope is of the form such that magnitude of the envelope after one time period T is the magnitude of the envelope at the original time multiplied by a constant multiplier (A), i.e., $y_{n+1}=y_n*A$.

Figure 4:
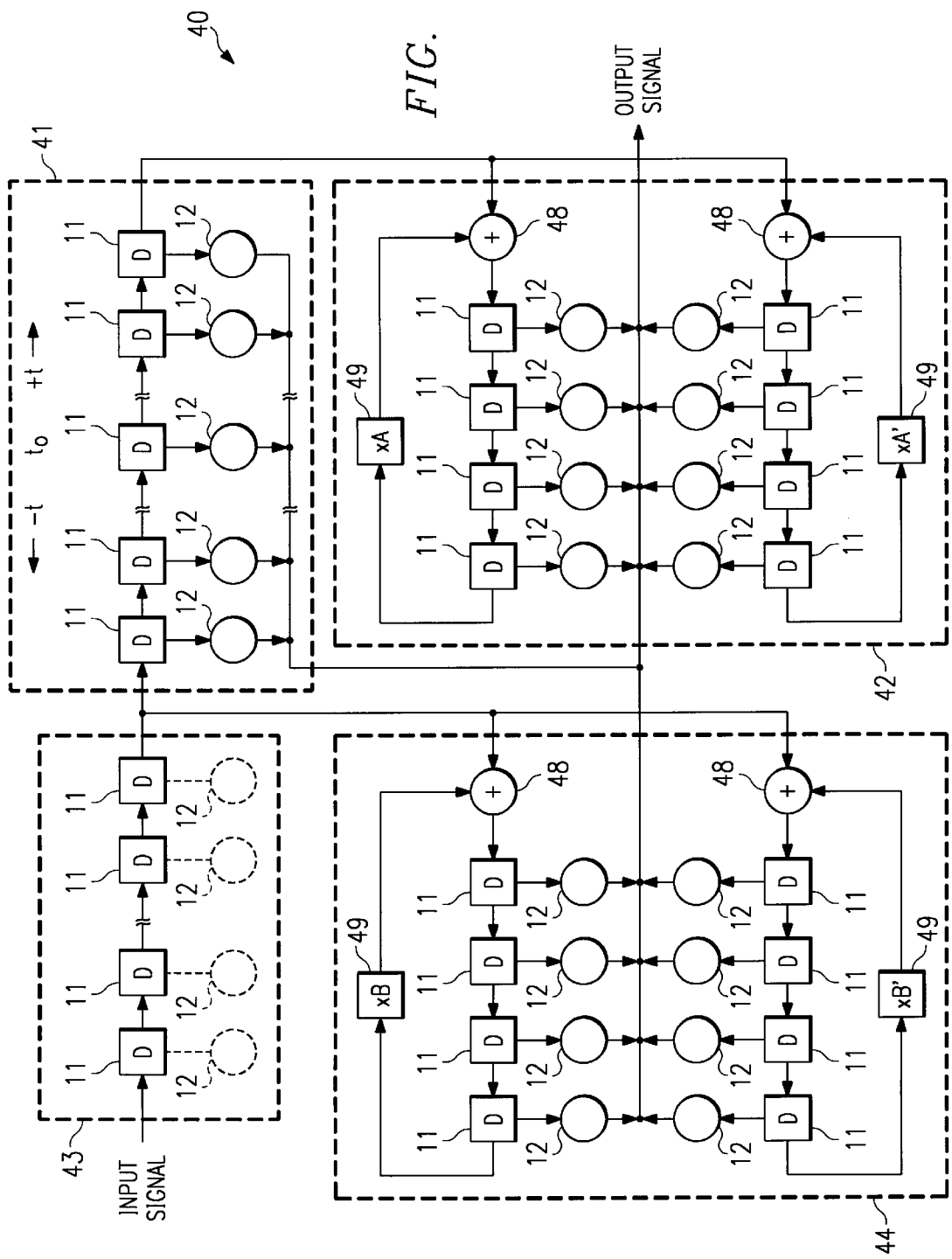
FIG. 4 illustrates the implementation of a sin(x)/x transform function in a digital filter according to the present invention.

Referring next to FIG. 4, an implementation of the digital filter with sin(x)/x transform function is shown. The portion 41 of the digital filter corresponding to the center portion of the transform function waveform includes a series-coupled group of delay components 11 including the center delay element $t_0$ corresponding to center of the transform function. The input signal is transmitted through a negative time group of delay components 43. The signal from the delay components 43 is applied to the center group of delay components 41. The delay components 11 of group 43 can have coefficient multiplier components 12 coupled thereto. The coefficient multiplier components 12 of group 43 can be coupled to the output signal bus (by conductors not shown). When the coefficient multiplier components 12 are not present in the negative time component group 43, then the signal from the negative time delay components is applied to the adder components 48 of a negative time component group 44 in addition to applying the signal to the center component group 41. The signal from each adder component 48 is applied to a series of delay components 11. The series of delay components 11 delay the signal one time period T and apply the resulting signal the constant multiplier unit 49. After being multiplied by a constant in the constant multiplier component 49, the resulting signal is applied to adder component 48 wherein the resulting signal is added to current signal from the negative time component group 43. Each delay component 11 has a coefficient multiplier unit 12 coupled thereto. The coefficient multiplier components apply a signal to the output signal bus. The signal transmitted by the center component group 41 is applied to adder components 48 of positive time component group 42. Thus, the delay components 11, the constant multiplier component 49, and the adder component 48 form a feedback circuit. The positive time component group 42 is implemented in the same fashion as the negative time component group 44.

Figure 5:
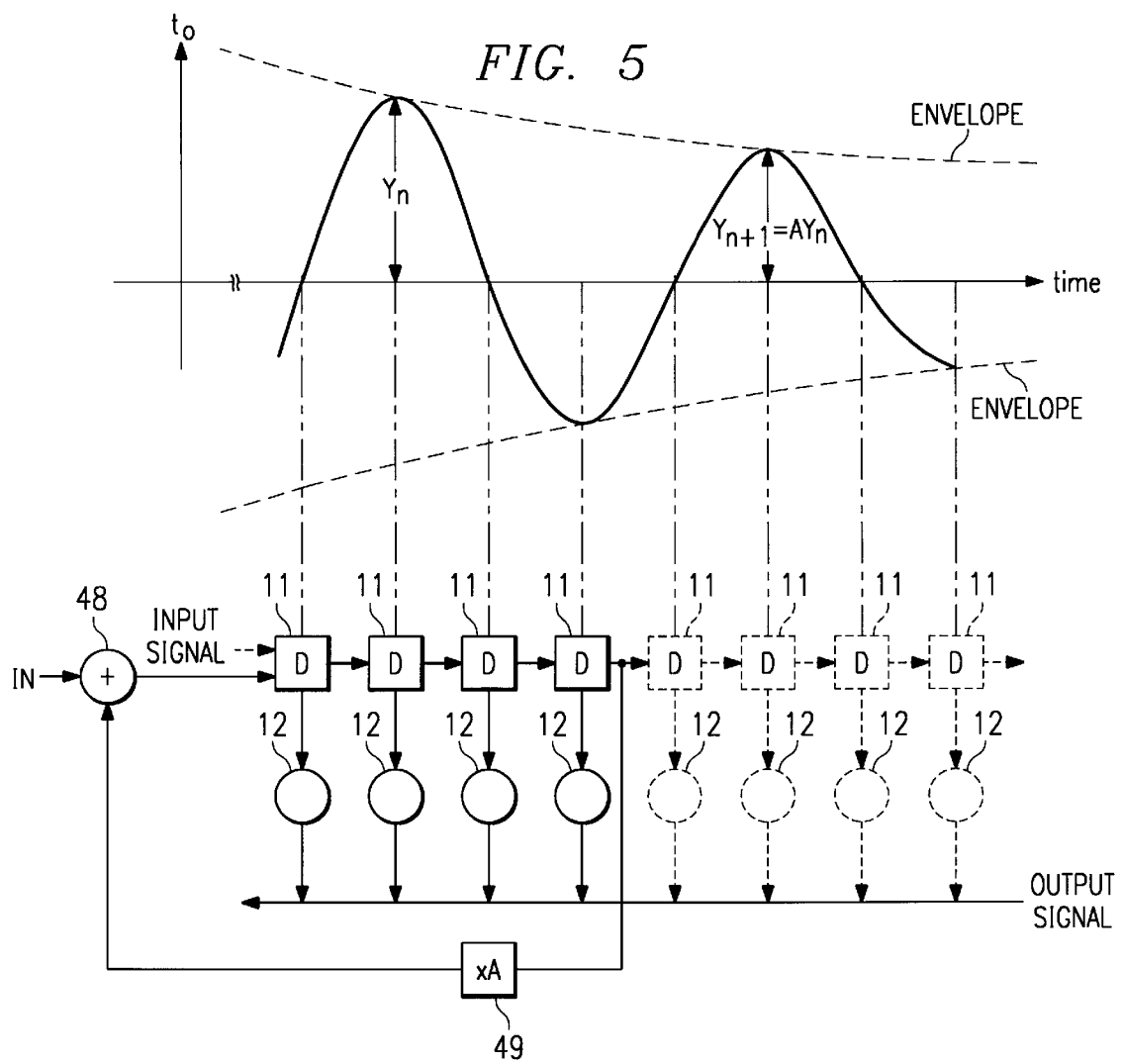
FIG. 5 illustrates a comparison of the present invention with the prior art digital filter implementation.

Referring to FIG. 5, the comparison of the generation of the transform coefficients in the prior art and present invention is shown. In the prior art digital filter implementation, the SIGNAL IN is transmitted through the all of the delay components, including the delay component shown by dashed lines. The coefficient multiplier components 12 derive the multipliers from the associated magnitude of the sin(x)/x waveform. In the present invention, the signals, after being delayed by one time period T, are operated on by the constant multiplier component 49 and combined with the SIGNAL IN one time period T later in adder component 48. The coefficient multiplier components 12 require the coefficients for only the first time period in the positive time portion of the digital filter.

Figure 6:
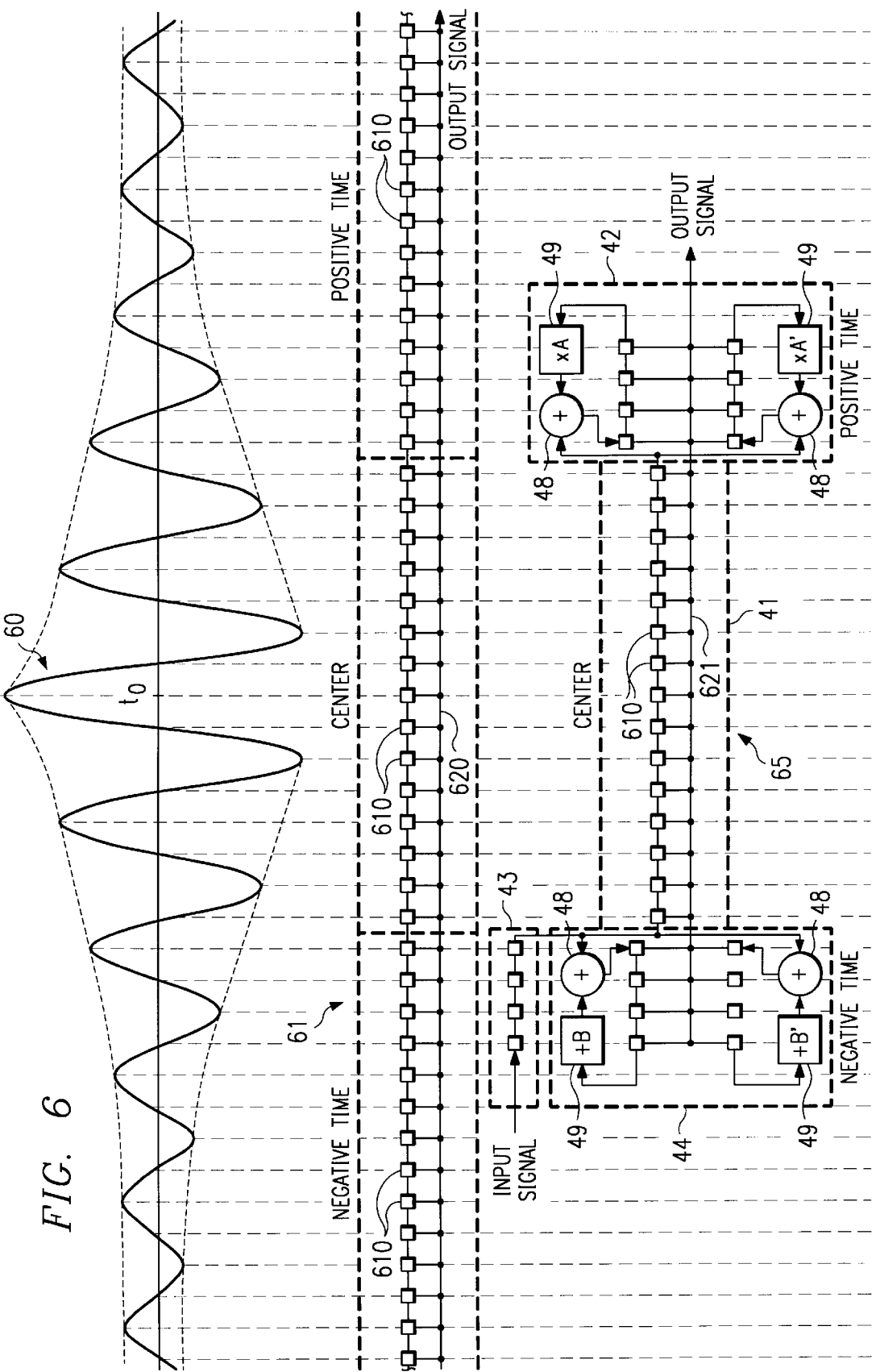
FIG. 6 is a comparison of a prior art filter with a filter according to the present invention.

Referring to FIG. 6, a comparison of a digital filter according to the prior art and a digital filter according to the present invention is provided. Curve 60 illustrates the transform function which is to be emulated by the a digital filter. The delay component/coefficient multiplier units 610 are coupled in a linear array for the digital filter 61 of the prior art. The signal to be filtered is entered at one end of the linear array of units 610. As the digitized signal is transmitted through each unit 610 with an selected delay. The digital signal in each unit 610 is multiplied by a number proportional to magnitude of the related transform curve 60 and applied to conductor 620. The OUTPUT SIGNAL of conductor 620 is the result of filtering the INPUT SIGNAL according to the transform function 60. The linear array can extend in either the positive time or the negative time direction until desired level of approximation has been achieved. The digital filter 65 of the present invention includes delay component/coefficient multiplier units 610. However, the digital filter 65 is configured into groups of components. The digital filter has a negative time component group 43, a negative time component group 44, a center time component group 41 (which corresponds to and is configured in a manner similar to a center time component group of the prior art digital filter 61), and a positive time component group 42. The negative time component group 44 and the positive time component group 42 are configured in a manner described with respect to FIG. 4. The component groups 44 and 42 include, in addition to delay component/coefficient multiplier units 610, summing components 48 and coefficient multiplier components 49. An INPUT SIGNAL is applied to negative time component group 43. An output signal from component group 43 is applied to the center component group, and to the negative time component group 44. The output signal from the center component group 41 is applied to the positive time component group 42. The signals from the coefficient multiplier components of the delay component/coefficient multiplier units 610 are applied to conductor 621, the signals combining in conductor 621 to form the OUTPUT SIGNAL.

2. Operation of the Preferred Embodiment(s)

The operation of the digital filter, illustrated in FIG. 4 and FIG. 6, implementing a sin(x)/x transform function, can be understood as follows. The center component group 41 uses the coefficients from appropriate positions of the sin(x)/x waveform in the coefficient multiplier components. Therefore, this portion of the digital filter is implemented in a manner known to the prior art. Similarly, when coefficient multiplier components 12 are coupled to the delay components in negative time component group 43 and the output signals from the coefficient multiplier components 12 of the negative time component group 43 are applied to the output signal bus, then the negative time portion of the digital filter has the coefficients for the coefficient multiplier components 12 of the negative time component group are selected from the waveform of the transform function. In this implementation, the negative time portion of the digital filter, in addition to the center portion of the digital filter is implemented according to the prior art.

With respect to the positive time component group, a reduced element structure, according to the present invention, is used. The positive time component group 42 includes two feedback circuits which circulate the signals therein. The sin(x)/x function can be approximated as the combination of a period signal within two decaying envelopes. Each of the feedback circuits provides the transform coefficients for one of the envelopes. The number of delay components in each of the feedback circuits results in a delay of one time period T from the application of a signal to the delay components 12 until the re-application of the signal to the delay components. The feedback circuit includes a constant multiplier component 49 which attenuates the feedback signal by a constant (A or A'). As is clear by consideration of FIG. 5, the present invention attenuates the SIGNAL IN by an amount that the transform function coefficients would reduced the same SIGNAL IN after one time period T when the output signals of the coefficient multiplier components are applied to the output terminal. Thus, by using the feedback circuit of the present invention, the signals from coefficient multiplier components of a single cycle for the periodic function is equal to signals from the coefficient multiplier component for the entire positive time portion of the transform function.

As indicated above, the present invention utilizes the fact the envelope decays at by a constant A for each time period, i.e., $y_{n+1}=y_n*A$. In the case of an exponential envelope decay, $A=Ke^{-\tau}(=T)/T=K$. The exponential decay therefor meets this requirement for implementation of the present invention. As previously stated, the positive and negative time portion envelope of the sin(x)/x function can be approximated by two exponential functions, and consequently, in FIG. 4, the constant multiplier components in the two positive time feedback circuits are different, i.e., A and A'.

With respect to the negative time portion of the digital filter, this portion of the filter can be implemented using the coefficient multiplier components with associated with the entire negative time portion of the transform function. In the alternative, a feedback circuit or feedback circuits 44, similar to the feedback circuit(s) in the positive time portion of the transform function can be used. In this implementation, the delay components are still used to provide a delay prior to the application of the INPUT SIGNAL to the center portion of the digital filter. In addition, the signal transmitted by the negative time delay component group is applied to the feedback circuit component group 44. The negative time feedback circuit component group 44 functions in a manner similar to the positive time feedback circuit component group 42. The constant factor(s) used by the constant multiplier component(s) 49 in the negative time feedback circuit group can be the same as the constants A and A' of the positive time feedback circuit group or can be different, e.g., the constant B and B' are shown in FIG. 4. With respect to the constants A, A', B, and B', by appropriate approximation of these constants, the apparatus for performing the multiplication and the cumulative round-off error, propagated as a result of the multiplicity of multiplication operations. For example, by approximating the binary number representing the constant by a few of the most significant bits, the apparatus performing the multiplication can be simplified and the fewer numbers will be rounded-off at the end of each multiplication.

While the present invention has been described with respect to two feedback circuits, this implementation described the two exponential decay used to approximate the envelope of the sin(x)/x transform function. It will be clear that a single feedback circuit can be used when an appropriate single function can be used to approximate the transform function envelope.

As will be clear, when the negative time feedback circuit component group is used in the filter, a further approximation is present. Both the signals and the transformation coefficients of the signals being used to sample the negative time region have been changed.

While the invention has been described with particular reference to the preferred embodiment, it will be under stood by those skilled in the art that various changes may be made and equivalents substituted for elements of the preferred embodiment without departing from the invention. For example, the negative time delay component group 43 is shown as a series of delay components in both the present and the absence of the negative time feedback circuit component group 44. In the present of the negative time feedback component group 44, the multiplicity of delay components 11 in component group 43 can be replaced by a smaller number of delay component but with longer delays in each component. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A digital filter, comprising:
    (a) an input node;
    (b) a first sequence of delay elements with associated coefficient multipliers coupled an output node, said first sequence of delay elements connected between said input node and a second node, said second node also connected to a second sequence of delay elements;
    (c) said second sequence of delay elements with associated coefficient multipliers coupled to said output node;
    (d) a feedback loop connected across said second sequence of delay elements;
    (e) a third sequence of delay elements with associated coefficient multipliers coupled to said output node, said third sequence of delay elements connected to said second node; and
    (f) a second feedback loop connected across said third sequence of delay elements.

2. The digital filter of claim 1, further comprising:
    (a) a fourth sequence of delay elements with associated coefficient multipliers coupled to said output node, said fourth sequence of delay elements connected to said first sequence of delay elements; and
    (b) a third feedback loop connected among said fourth sequence of delay elements.

3. The filter of claim 2, wherein:
    (a) said second feedback loop contains a multiplier.

4. The filter of claim 2, further comprising:
    (a) an input sequence of delay elements between said input node and said first sequence of delay elements.

5. The filter of claim 1, wherein:
    (a) said second feedback loop contains a multiplier.

* * * * *